US010297388B2

(12) United States Patent
Kato

(10) Patent No.: US 10,297,388 B2
(45) Date of Patent: *May 21, 2019

(54) MULTILAYER CERAMIC CAPACITOR

(71) Applicant: TAIYO YUDEN CO., LTD., Taito-ku, Tokyo (JP)

(72) Inventor: Yoichi Kato, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/461,242

(22) Filed: Mar. 16, 2017

(65) Prior Publication Data
US 2017/0278633 A1 Sep. 28, 2017

(30) Foreign Application Priority Data

Mar. 25, 2016 (JP) .................................. 2016-061494

(51) Int. Cl.
| H01G 4/248 | (2006.01) |
| H01G 4/30 | (2006.01) |
| H01G 4/232 | (2006.01) |
| H05K 3/34 | (2006.01) |
| H01G 4/12 | (2006.01) |

(52) U.S. Cl.
CPC .............. *H01G 4/248* (2013.01); *H01G 4/232* (2013.01); *H01G 4/2325* (2013.01); *H01G 4/30* (2013.01); *H05K 3/3442* (2013.01); *H01G 4/12* (2013.01)

(58) Field of Classification Search
None
See application file for complete search history.

(56) References Cited

U.S. PATENT DOCUMENTS

2015/0022945 A1* 1/2015 Park et al. ............... H01G 4/30
2016/0276104 A1* 9/2016 Nishisaka et al. ..... H01G 4/105
(Continued)

FOREIGN PATENT DOCUMENTS

| JP | 2005012167 A | 1/2005 |
| JP | 2008283170 A | 11/2008 |

(Continued)

OTHER PUBLICATIONS

A Notification of Reasons for Refusal issued by the Japanese Patent Office, dated Mar. 1, 2018, for Japanese counterpart application No. 2016-061494.

*Primary Examiner* — Dion Ferguson
(74) *Attorney, Agent, or Firm* — Law Office of Katsuhiro Arai

(57) ABSTRACT

In an embodiment, one length-direction end of each first internal electrode layer 111*a* is connected to the first conductor layer 112 of the capacitor body 110 over a connection width equivalent to the width of each first internal electrode layer 111*a*, while the other length-direction end of each second internal electrode layer 111*b* is connected to the second conductor layer 113 over a connection width equivalent to the width of each second internal electrode layer 111*b*. One height-direction end of the first conductor layer 112 is connected to the first external electrode 120 over a connection width equivalent to the width of the first conductor layer 112, while one height-direction end of the second conductor layer 113 is connected to the second external electrode 130 over a connection width equivalent to the width of the second conductor layer 113.

19 Claims, 10 Drawing Sheets

(56) References Cited

U.S. PATENT DOCUMENTS

| | | | | |
|---|---|---|---|---|
| 2017/0032897 A1* | 2/2017 | Sasaki et al. | ............ | H01G 4/30 |
| 2017/0278634 A1* | 9/2017 | Kato | ........................ | H01G 4/30 |
| 2017/0278635 A1* | 9/2017 | Mizuno et al. | .......... | H01G 4/30 |

FOREIGN PATENT DOCUMENTS

| | | | |
|---|---|---|---|
| JP | 2014116571 A | | 6/2014 |
| JP | 2015065284 A | | 4/2015 |
| JP | 2015204451 A | | 11/2015 |
| JP | 2016111280 A | | 6/2016 |

\* cited by examiner

FIG. 18A
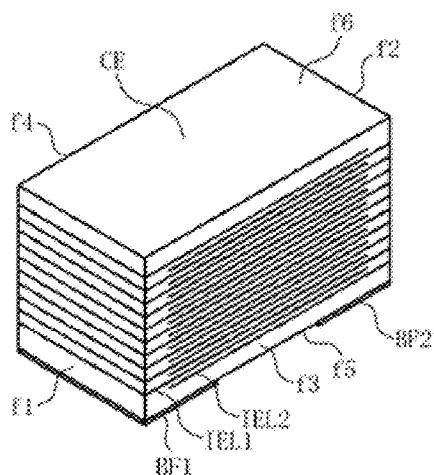
FIG. 18B
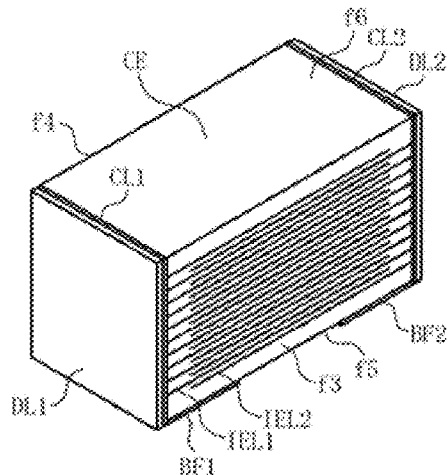
FIG. 18C
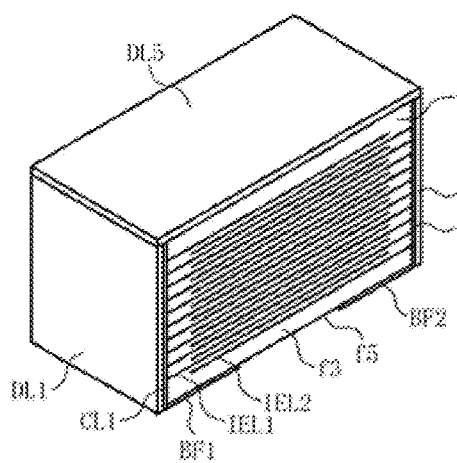
FIG. 18D dimension (width) of each first lead part, and the length-direction dimension (width) of each second lead part, become extremely small when, in particular, the length-direction dimension decreases, and this tends to make the connection of each first lead part with the first external electrode, and the connection of each second lead part with the second external electrode, unstable.

MULTILAYER CERAMIC CAPACITOR

BACKGROUND

Field of the Invention

The present invention relates to a multilayer ceramic capacitor comprising a capacitor body of roughly rectangular solid shape, as well as a first external electrode and a second external electrode that are provided on one height-direction face thereof.

Description of the Related Art

FIGS. 1 to 7 of Patent Literature 1 mentioned below disclose a multilayer ceramic capacitor relating to the foregoing. This multilayer ceramic capacitor comprises: a capacitor body of roughly rectangular solid shape, which contains multiple first internal electrode layers of roughly rectangular shape and multiple second internal electrode layers of roughly rectangular shape that are arranged alternately, in the width direction, with dielectric layers in between; as well as a first external electrode of roughly rectangular shape and a second external electrode of roughly rectangular shape, which are provided on one height-direction face of the capacitor body. Each first internal electrode layer has a first lead part of roughly rectangular shape that continues to one height-direction face of the capacitor body, and an end of each first lead part is connected to the first external electrode. Each second internal electrode layer has a second lead part of roughly rectangular shape that continues to one height-direction face of the capacitor body, and an end of each second lead part is connected to the second external electrode.

The aforementioned multilayer ceramic capacitor is constructed in such a way that each first internal electrode layer and each second internal electrode layer are oriented at roughly right angles with the first external electrode and second external electrode, and consequently the length-direction dimension (width) of each first lead part is smaller than the height-direction dimension (width) of each first internal electrode layer, while the length-direction dimension (width) of each second lead part is smaller than the height-direction dimension (width) of each second internal electrode layer. Accordingly, an attempt to meet the demand for size reduction and capacitance increase based on the aforementioned multilayer ceramic capacitor raises the concern that the connection of each first lead part with the first external electrode, and the connection of each second lead part with the second external electrode may become unstable.

To be specific, meeting the demand for size reduction and capacitance increase based on the aforementioned multilayer ceramic capacitor requires decreasing the height-direction dimension (width) and length-direction dimension of each first internal electrode layer, as well as the height-direction dimension (width) and length-direction dimension of each second internal electrode layer; however, the length-

BACKGROUND ART LITERATURES

[Patent Literature 1] Japanese Patent Laid-open No. 2014-116571

SUMMARY

An object of the present invention is to provide a multilayer ceramic capacitor comprising a capacitor body of roughly rectangular solid shape, as well as a first external electrode and a second external electrode that are provided on one height-direction face thereof; wherein such multilayer ceramic capacitor can achieve reliable connection with respect to the connection of each first internal electrode layer to the first external electrode, and also with respect to the connection of each second internal electrode layer to the second external electrode, even when meeting the demand for size reduction and capacitance increase.

Any discussion of problems and solutions involved in the related art has been included in this disclosure solely for the purposes of providing a context for the present invention, and should not be taken as an admission that any or all of the discussion were known at the time the invention was made.

To achieve the aforementioned object, the multilayer ceramic capacitor pertaining to the present invention is a multilayer ceramic capacitor comprising a capacitor body of roughly rectangular solid shape, as well as a first external electrode of roughly rectangular shape and a second external electrode of roughly rectangular shape that are provided on one height-direction face thereof, wherein: the capacitor body comprises (1) a capacitive element of roughly rectangular solid shape, which contains multiple first internal electrode layers of roughly rectangular shape and multiple second internal electrode layers of roughly rectangular shape that are arranged alternately with dielectric layers in between, (2) a first conductor layer covering one length-direction face of the capacitive element, (3) a second conductor layer covering the other length-direction face of the capacitive element, (4) a first cover layer covering the exterior face of the first conductor layer, (5) a second cover layer covering the exterior face of the second conductor layer, (6) a third cover layer covering one width-direction face of the capacitive element, one width-direction end of the first conductor layer and one width-direction end of the second conductor layer, while also in contact with one width-direction end of the first cover layer and one width-direction end of the second cover layer, and (7) a fourth cover layer covering the other width-direction face of the capacitive element, the other width-direction end of the first conductor layer and the other width-direction end of the second conductor layer, while also in contact with the other width-direction end of the first cover layer and the other width-direction end of the second cover layer; where one length-direction ends of the multiple first internal electrode layers are connected to the first conductor layer over connection widths that are equivalent to the respective widths of the multiple first internal electrode layers; the other length-direction ends of the multiple second internal electrode layers are connected to the second conductor layer over connection widths that are equivalent to the respective widths of the multiple second internal electrode layers; one height-direction end of the first conductor layer is connected to the first external electrode over a connection width equivalent to the width of the first conductor layer; and one height-direction end of the second conductor layer is connected to the second external electrode over a connection width equivalent to the width of the second conductor layer.

According to the present invention, a multilayer ceramic capacitor comprising a capacitor body of roughly rectangular solid shape, as well as a first external electrode and a second external electrode that are provided on one height-direction face thereof, can be provided; wherein such multilayer ceramic capacitor can achieve reliable connection with respect to the connection of each first internal electrode layer to the first external electrode, and also with respect to the connection of each second internal electrode layer to the second external electrode, even when meeting the demand for size reduction and capacitance increase.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIGS. 18A to 18D are drawings provided to explain an example of a manufacturing method of the multilayer ceramic capacitor shown in FIG. 13.

DESCRIPTION OF THE SYMBOLS

Figures 1, 2:
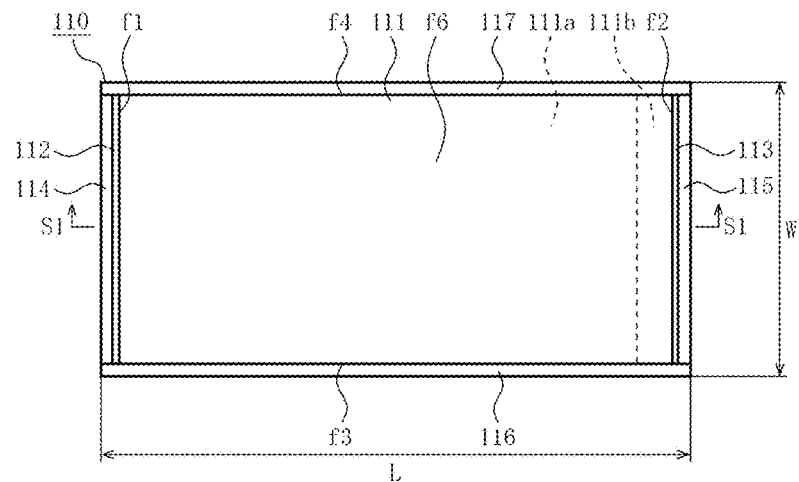
FIG. 1 is a view of the multilayer ceramic capacitor pertaining to the first embodiment of the present invention, from the sixth face f6 side of the capacitive element.
FIG. 2 is a view of the multilayer ceramic capacitor shown in FIG. 1, from the third face f3 side of the capacitive element.
Figure 3:
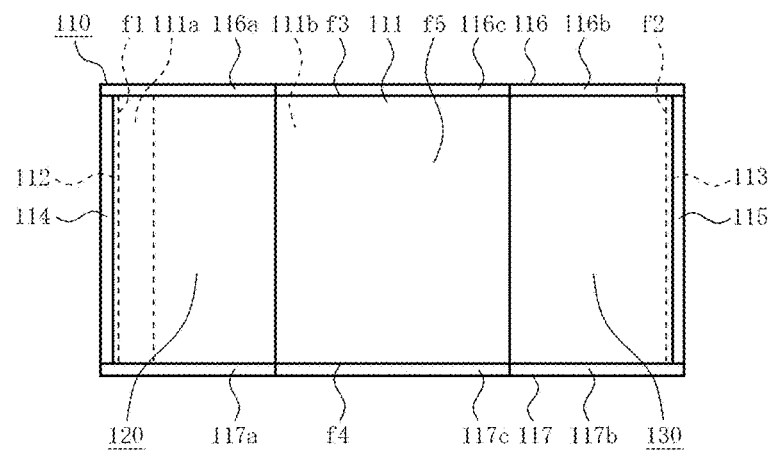
FIG. 3 is a view of the multilayer ceramic capacitor shown in FIG. 1, from the fifth face f5 side of the capacitive element.
Figure 4:
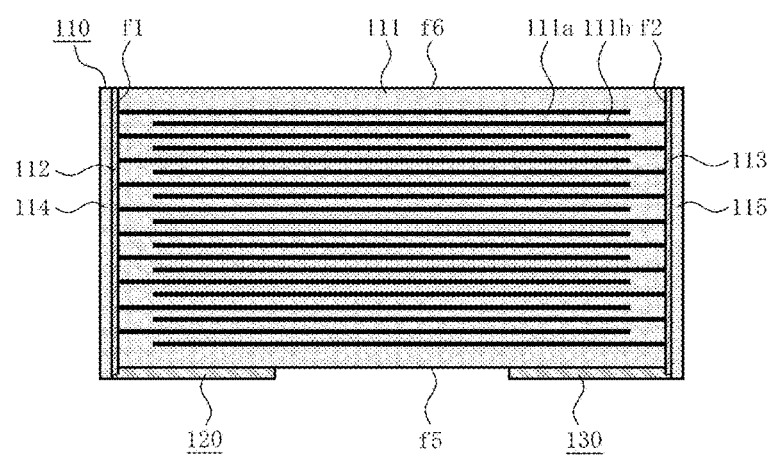
FIG. 4 is a section view of FIG. 1 along line S1-S1.

110 - - - Capacitor body, 111 - - - Capacitive element, 111a - - - First internal electrode layer, 111b - - - Second internal electrode layer, 112 - - - First conductor layer, 113 - - - Second conductor layer, 114 - - - First cover layer, 114a - - - Supporting part of the first cover layer, 115 - - - Second cover layer, 115a - - - Supporting part of the second cover layer, 116 - - - Third cover layer, 116a - - - First supporting part of the third cover layer, 116b - - - Second supporting part of the third cover layer, 117 - - - Fourth cover layer, 117a - - - First supporting part of the fourth cover layer, 117b - - - Second supporting part of the fourth cover layer, 120 - - - First external electrode, 121 - - - Base film of the first external electrode, 122 - - - Intermediate film of the first external electrode, 123 - - - Surface film of the first external electrode, 130 - - - Second external electrode, 131 - - - Base film of the second external electrode, 132 - - - Intermediate film of the second external electrode, 133 - - - Surface film of the second external electrode, 210 - - - Capacitor body, 211 - - - Capacitive element, 211a - - - First internal electrode layer, 211b - - - Second internal electrode layer, 212 - - - First conductor layer, 213 - - - Second conductor layer, 214 - - - First cover layer, 214a - - - Supporting part of the first cover layer, 215 - - - Second cover layer, 215a - - - Supporting part of the second cover layer, 216 - - - Third cover layer, 216a - - - First supporting part of the third cover layer, 216b - - - Second supporting part of the third cover layer, 217 - - - Fourth cover layer, 217a - - - First supporting part of the fourth cover layer, 217b - - - Second supporting part of the fourth cover layer, 218 - - - Fifth cover layer, 220 - - - First external electrode, 221 - - - Base film of the first external electrode, 222 - - - Intermediate film of the first external electrode, 223 - - - Surface film of the first external electrode, 230 - - - Second external electrode, 231 - - - Base film of the second external electrode, 232 - - - Intermediate film of the second external electrode, 233 - - - Surface film of the second external electrode, 310 - - - Capacitor body, 311 - - - Capacitive element, 311a - - - First internal electrode layer, 311b - - - Second internal electrode layer, 312 - - - First conductor layer, 313 - - - Second conductor layer, 314 - - - First cover layer, 314a - - - Supporting part of the first cover layer, 315 - - - Second cover layer, 315a - - - Supporting part of the second cover layer, 316 - - - Third cover layer, 316a - - - First supporting part of the third cover layer, 316b - - - Second supporting part of the third cover layer, 317 - - - Fourth cover layer, 317a - - - First supporting part of the fourth cover layer, 317b - - - Second supporting part of the fourth cover layer, 318 - - - Fifth cover layer, 320 - - - First external electrode, 321 - - - Base film of the first external electrode, 322 - - - Intermediate film of the first external electrode, 323 - - - Surface film of the first external electrode, 330 - - - Second external electrode, 331 - - - Base film of the second external electrode, 332 - - - Intermediate film of the second external electrode, 333 - - - Surface film of the second external electrode.

DETAILED DESCRIPTION OF EMBODIMENTS

First Embodiment

First, the construction of the multilayer ceramic capacitor pertaining to the first embodiment of the present invention is explained using FIGS. 1 to 5B. In this explanation, the left/right or horizontal direction in FIG. 1 represents the length direction, the up/down or vertical direction in FIG. 1 represents the width direction, and the up/down or vertical direction in FIG. 2 represents the height direction, while the dimensions of each component in the length direction, width direction, and height direction represent the length, width, and height of the component, respectively.

This multilayer ceramic capacitor comprises a capacitor body 110 of roughly rectangular solid shape, as well as a first external electrode 120 of roughly rectangular shape and a second external electrode 130 of roughly rectangular shape that are provided on one height-direction face of the capacitor body 110, and its overall dimensions are specified by length L, width W, and height H. Incidentally, the length L, width W, and height H of the multilayer ceramic capacitor shown in FIGS. 1 to 5B are 1000 μm, 500 μm, and 500 μm, respectively, or 600 μm, 300 μm, and 300 μm, respectively, for example. It should be noted that, while a multilayer ceramic capacitor whose length L, width W, and height H meet the condition of "Length L>Width W=Height H" is depicted in FIGS. 1 to 5B respectively, the relationship of length L, width W, and height H may be "Length L>Width W>Height H" or "Length L>Height H>Width W," or it may also be "Width W>Length L=Height H," "Width W>Length L>Height H" or "Width W>Height H>Length L."

The capacitor body 110 is constituted by a capacitive element 111, a first conductor layer 112, a second conductor layer 113, a first cover layer 114, a second cover layer 115, a third cover layer 116, and a fourth cover layer 117.

The capacitive element 111 is roughly a rectangular solid in shape, and has a first face f1 and a second face f2 facing each other in the length direction, a third face f3 and a fourth face f4 facing each other in the width direction, and a fifth face f5 and a sixth face f6 facing each other in the height direction. Also, the capacitive element 111 contains multiple first internal electrode layers 111a of roughly rectangular shape and multiple second internal electrode layers 111b of roughly rectangular shape that are arranged alternately, in the height direction, with dielectric layers (not accompanied by symbol) in between. The width of the capacitive element 111 is roughly the same as the width of each first internal electrode layer 111a and that of each second internal electrode layer 111b (refer to FIG. 6A). The width, length, and thickness of each first internal electrode layer 111a are roughly the same as the width, length, and thickness of each second internal electrode layer 111b, while each dielectric layer has roughly the same thickness. Incidentally, the thickness of each first internal electrode layer 111a and that of each second internal electrode layer 111b are set in a range of 0.5 to 2 μm, for example, while the thickness of each dielectric layer is set in a range of 0.5 to 2 μm, for example. It should be noted that, while 10 first internal electrode layers 111a and 10 second internal electrode layers 111b are depicted in FIGS. 1 to 5B, this is for the purpose of illustration and the number of first internal electrode layers 111a and that of second internal electrode layers 111b may be 11 or more.

For the capacitive element 111, except for each first internal electrode layer 111a and each second internal electrode layer 111b, a dielectric ceramic whose primary component is barium titanate, strontium titanate, calcium titanate, magnesium titanate, calcium zirconate, calcium zirconate titanate, barium zirconate, titanium oxide, etc., or preferably a high dielectric ceramic whose specific dielectric constant is 1000 or higher, may be used. Also, for each first internal electrode layer 111a and each second internal electrode layer 111b, a good conductor whose primary component is nickel, copper, palladium, platinum, silver, gold, or alloy thereof, etc., may be used.

The first conductor layer 112 is roughly rectangular in shape, and is in contact with and covers the first face f1 of the capacitive element 111. The width of the first conductor layer 112 is roughly the same as the width of the first face f1, but its height is slightly higher than the height of the first face f1, and this higher part projects toward the first external electrode 120 side. Because it relates to the length of the capacitor body 110, desirably the thickness of the first conductor layer 112 is as thin as possible. Incidentally, the thickness of the first conductor layer 112 is set in a range of one to five times the thickness of the first internal electrode layer 111a, or preferably in a range of 0.5 to 5 μm, for example. Also, for the first conductor layer 112, a good conductor whose primary component is nickel, copper, palladium, platinum, silver, gold, or alloy thereof, etc., or preferably a good conductor whose primary component is the same as the primary component of the first internal electrode layer 111a, may be used. To this first conductor layer 112, one length-direction end of each first internal electrode layer 111a is connected over a connection width equivalent to the width of each first internal electrode layer 111a. It should be noted that, while the connection width of one length-direction end of each first internal electrode layer 111a to the first conductor layer 112 is ideally the width of each first internal electrode layer 111a, in reality the width of one length-direction end of each first internal electrode layer 111a was confirmed to vary by approx. ±5% of the width of each first internal electrode layer 111a, and therefore the expression "connection width equivalent to the width of each first internal electrode layer 111a" is intentionally used here, instead of "connection width identical to the width of each first internal electrode layer 111a."

The second conductor layer 113 is roughly rectangular in shape, and is in contact with and covers the second face f2 of the capacitive element 111. The width of the second conductor layer 113 is roughly the same as the width of the second face f2, but its height is slightly higher than the height of the second face f2, and this higher part projects toward the second external electrode 130 side. Because it relates to the length of the capacitor body 110, desirably the thickness of the second conductor layer 113 is as thin as possible. Incidentally, the thickness of the second conductor layer 113 is set in a range of one to five times the thickness of the second internal electrode layer 111b, or preferably in a range of 0.5 to 5 μm, for example. Also, for the second conductor layer 113, a good conductor whose primary component is nickel, copper, palladium, platinum, silver, gold, or alloy thereof, etc., or preferably a good conductor whose primary component is the same as the primary component of the second internal electrode layer 111b, may be used. To this second conductor layer 113, the other length-direction end of each second internal electrode layer 111b is connected over a connection width equivalent to the width of each second internal electrode layer 111b. It should be noted that, while the connection width of the other length-direction end of each second internal electrode layer 111b to the second conductor layer 113 is ideally the width of each second internal electrode layer 111b, in reality the width of the other length-direction end of each second internal electrode layer 111b was confirmed to vary by approx. ±5% of the width of each second internal electrode layer 111b, and therefore the expression "connection width equivalent to the width of each second internal electrode layer 111b" is intentionally used here, instead of "connection width identical to the width of each second internal electrode layer 111b."

The first cover layer 114 is roughly rectangular in shape, and is in contact with and covers the exterior face of the first conductor layer 112. The width of the first cover layer 114 is roughly the same as the width of the exterior face of the first conductor layer 112, but its height is slightly higher than the height of the exterior face of the first conductor layer 112, and this higher part constitutes a supporting part 114a that extends to one length-direction end of the first external electrode 120 (refer to FIG. 5A). Because it relates to the length of the capacitor body 110, desirably the thickness of the first cover layer 114 is as thin as possible. Incidentally, the thickness of the first cover layer 114 is set in a range of one to 10 times the thickness of the dielectric layer present between the first internal electrode layer 111a and second internal electrode layer 111b, or preferably in a range of 1 to 10 μm (typically thicker than the first conductor layer 112), for example. Also, for the first cover layer 114, a dielectric ceramic whose primary component is barium titanate, strontium titanate, calcium titanate, magnesium titanate, calcium zirconate, calcium zirconate titanate, barium zirconate, titanium oxide, etc., or preferably a high dielectric ceramic whose specific dielectric constant is 1000 or higher, or more preferably a dielectric ceramic whose primary component is the same as the primary component of the capacitive element 111 except for the first internal electrode layer 111a and second internal electrode layer 111b, may be used.

The second cover layer 115 is roughly rectangular in shape, and is in contact with and covers the exterior face of the second conductor layer 113. The width of the second cover layer 115 is roughly the same as the width of the exterior face of the second conductor layer 113, but its height is slightly higher than the height of the exterior face of the second conductor layer 113, and this higher part constitutes a supporting part 115a that extends to the other length-direction end of the second external electrode 130 (refer to FIG. 5B). Because it relates to the length of the capacitor body 110, desirably the thickness of the second cover layer 115 is as thin as possible. Incidentally, the thickness of the second cover layer 115 is set in a range of one to 10 times the thickness of the dielectric layer present between the first internal electrode layer 111a and second internal electrode layer 111b, or preferably in a range of 1 to 10 μm (typically thicker than the second conductor layer 113), or more preferably roughly the same as the thickness of the first cover layer 114, for example. Also, for the second cover layer 115, a dielectric ceramic whose primary component is barium titanate, strontium titanate, calcium titanate, magnesium titanate, calcium zirconate, calcium zirconate titanate, barium zirconate, titanium oxide, etc., or preferably a high dielectric ceramic whose specific dielectric constant is 1000 or higher, or more preferably a dielectric ceramic whose primary component is the same as the primary component of the capacitive element 111 except for the first internal electrode layer 111a and second internal electrode layer 111b, may be used.

The third cover layer 116 is roughly rectangular in shape, and is in contact with and covers the third face f3 of the capacitive element 111, one width-direction end of the first conductor layer 112, and one width-direction end of the second conductor layer 113, while also in contact with one width-direction end of the first cover layer 114 and one width-direction end of the second cover layer 115. The length of the third cover layer 116 is roughly the same as the sum of the length of the third face f3 of the capacitive element 111, thickness of the first conductor layer 112, thickness of the second conductor layer 113, thickness of the first cover layer 114, and thickness of the second cover layer 115. The height of the length-direction center of the third cover layer 116 equals the height of the third face f3 of the capacitive element 111, but the heights of the two length-direction ends are slightly higher than the height of the third face f3 of the capacitive element 111, and these higher parts constitute a first supporting part 116a that extends to one width-direction end of the first external electrode 120 and a second supporting part 116b that extends to one width-direction end of the second external electrode 130, respectively (refer to FIGS. 2 and 3). In other words, the third cover layer 116 is shaped in such a way that it has a U-shaped cutout 116c at the center on one height-direction end, as well as the first supporting part 116a of rectangular shape and second supporting part 116b of rectangular shape on both sides of it. Because it relates to the width of the capacitor body 110, desirably the thickness of the third cover layer 116 is as thin as possible. Incidentally, the thickness of the third cover layer 116 is set in a range of one to 20 times the thickness of the first cover layer 114 or that of the second cover layer 115, or preferably in a range of 5 to 20 μm, for example. Also, for the third cover layer 116, a dielectric ceramic whose primary component is barium titanate, strontium titanate, calcium titanate, magnesium titanate, calcium zirconate, calcium zirconate titanate, barium zirconate, titanium oxide, etc., or preferably a high dielectric ceramic whose specific dielectric constant is 1000 or higher, or more preferably a dielectric ceramic whose primary component is the same as the primary component of the capacitive element 111 except for the first internal electrode layer 111a and second internal electrode layer 111b, may be used.

The fourth cover layer 117 is roughly rectangular in shape, and is in contact with and covers the fourth face f4 of the capacitive element 111, the other width-direction end of the first conductor layer 112, and the other width-direction end of the second conductor layer 113, while also in contact with the other width-direction end of the first cover layer 114 and the other width-direction end of the second cover layer 115. The length of the fourth cover layer 117 is roughly the same as the length of the third cover layer 116. The height of the length-direction center of the fourth cover layer 117 equals the height of the fourth face f4 of the capacitive element 111, but the heights of the two length-direction ends are slightly higher than the height of the fourth face f4 of the capacitive element 111, and these higher parts constitute a first supporting part 117a that extends to the other width-direction end of the first external electrode 120 and a second supporting part 117b that extends to the other width-direction end of the second external electrode 130, respectively (refer to FIG. 3). In other words, the fourth cover layer 117 is shaped in such a way that it has a U-shaped cutout 117c at the center on one height-direction end, as well as the first supporting part 117a of rectangular shape and second supporting part 117b of rectangular shape on both sides of it, just like the third cover layer 116. Because it relates to the width of the capacitor body 110, desirably the thickness of the fourth cover layer 117 is as thin as possible. Incidentally, the thickness of the fourth cover layer 117 is set in a range of one to 20 times the thickness of the first cover layer 114 or that of the second cover layer 115, or preferably in a range of 5 to 20 μm, for example. Also, for the fourth cover layer 117, a dielectric ceramic whose primary component is barium titanate, strontium titanate, calcium titanate, magnesium titanate, calcium zirconate, calcium zirconate titanate, barium zirconate, titanium oxide, etc., or preferably a high dielectric ceramic whose specific dielectric constant is 1000 or higher, or more preferably a dielectric ceramic whose primary component is the same as the primary component of the capacitive element 111 except for the first internal electrode layer 111a and second internal electrode layer 111b, may be used.

Figure 5A:
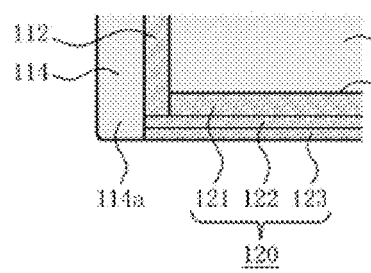
FIGS. 5A and 5B are each a partially enlarged view of FIG. 4.
Figure 5B:
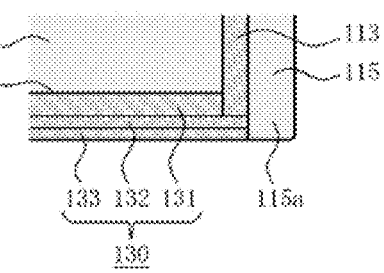

The first external electrode 120 is roughly rectangular in shape, and provided in contact with the first cover layer 114 side of the fifth face f5 of the capacitive element 111 corresponding to one height-direction face of the capacitor body 110. The width of the first external electrode 120 is roughly the same as the width of the fifth face f5 of the capacitive element 111, while its length is set in a range of one-eighth to one-third the length L of the multilayer ceramic capacitor, for example, and its thickness is set in a range of 1 to 15 μm, for example. Also, one length-direction end of the first external electrode 120 is supported by the supporting part 114a of the first cover layer 114, while one width-direction end of it is supported by the first supporting part 116a of the third cover layer 116, and the other width-direction end of it is supported by the first supporting part 117a of the fourth cover layer 117 (refer to FIGS. 2, 3, 5A, and 5B). To this first external electrode 120, one height-direction end of the first conductor layer 112 is connected over a connection width equivalent to the width of the first conductor layer 112. It should be noted that, while the connection width of one height-direction end of the first conductor layer 112 to the first external electrode 120 is ideally the width of the first conductor layer 112, in reality the width of one height-direction end of the first conductor layer 112 was confirmed to vary by approx. ±5% of the width of the first conductor layer 112, and therefore the expression "connection width equivalent to the width of the first conductor layer 112" is intentionally used here, instead of "connection width identical to the width of the first conductor layer 112." Additionally, while FIGS. 2, 5A, and 5B show that one length-direction end, one width-direction end, and the other width-direction end of the first external electrode 120 are covered and hidden by the supporting part 114a of the first cover layer 114, first supporting part 116a of the third cover layer 116, and first supporting part 117a of the fourth cover layer 117, one length-direction end, one width-direction end, and the other width-direction end of the first external electrode 120 need not be covered and hidden by the respective supporting parts 114a, 116a, 117a so long as the respective supporting parts 114a, 116a, 117a extend to one length-direction end, one width-direction end, and the other width-direction end of the first external electrode 120. In other words, one length-direction end, one width-direction end, and the other width-direction end of the first external electrode 120 may be covered by the respective supporting parts 114a, 116a, 117a in such a way that the exterior side of the first external electrode 120 in the thickness direction, such as the intermediate film 122 and surface film 123 shown in FIG. 5A, is exposed.

The second external electrode 130 is roughly rectangular in shape, and provided in contact with the second cover layer 115 side of the fifth face f5 of the capacitive element 111 corresponding to one height-direction face of the capacitor body 110. The width of the second external electrode 130 is roughly the same as the width of the fifth face f5 of the capacitive element 111, while its length is set in a range of one-eighth to one-third the length L of the multilayer ceramic capacitor, for example, and its thickness is set in a range of 1 to 15 μm, for example. Also, the other length-direction end of the second external electrode 130 is supported by the supporting part 115a of the second cover layer 115, while one width-direction end of it is supported by the second supporting part 116b of the third cover layer 116, and the other width-direction end of it is supported by the second supporting part 117b of the fourth cover layer 117 (refer to FIGS. 2, 3, 5A, and 5B). To this second external electrode 130, one height-direction end of the second conductor layer 113 is connected over a connection width equivalent to the width of the second conductor layer 113. It should be noted that, while the connection width of one height-direction end of the second conductor layer 113 to the second external electrode 130 is ideally the width of the second conductor layer 113, in reality the width of one height-direction end of the second conductor layer 113 was confirmed to vary by approx. ±5% of the width of the second conductor layer 113, and therefore the expression "connection width equivalent to the width of the second conductor layer 113" is intentionally used here, instead of "connection width identical to the width of the second conductor layer 113." Additionally, while FIGS. 2, 5A, and 5B show that the other length-direction end, one width-direction end, and the other width-direction end of the second external electrode 130 are covered and hidden by the supporting part 115a of the second cover layer 115, second supporting part 116b of the third cover layer 116, and second supporting part 117b of the fourth cover layer 117, the other length-direction end, one width-direction end, and the other width-direction end of the second external electrode 130 need not be covered and hidden by the respective supporting parts 115a, 116b, 117b so long as the respective supporting parts 115a, 116b, 117b extend to the other length-direction end, one width-direction end, and the other width-direction end of the second external electrode 130. In other words, the other length-direction end, one width-direction end, and the other width-direction end of the second external electrode 130 may be covered by the respective supporting parts 115a, 116b, 117b in such a way that the exterior side of the second external electrode 130 in the thickness direction, such as the intermediate film 132 and surface film 133 shown in FIG. 5B, is exposed.

Here, the embodiment of the first external electrode 120 and second external electrode 130 is supplemented using FIGS. 5A and 5B.

The first external electrode 120 shown in FIG. 5A has a three-layer structure primarily consisting of a base film 121 contacting the fifth face f5 of the capacitive element 111, an intermediate film 122 contacting the exterior face of the base film 121, and a surface film 123 contacting the exterior face of the intermediate film 122. Also, the second external electrode 130 shown in FIG. 5B has a three-layer structure primarily consisting of a base film 131 contacting the fifth face f5 of the capacitive element 111, an intermediate film 132 contacting the exterior face of the base film 131, and a surface film 133 contacting the exterior face of the intermediate film 132. It should be noted that the first external electrode 120 and second external electrode 130 need not have a three-layer structure; instead, they can have a two-layer structure having no intermediate film 122 or 132, a multi-layer structure having two or more intermediate films 122 or 132, or a single-layer structure having only a surface film 123 or 133.

When an example based on a three-layer structure is explained, the base films 121, 131 are constituted by a baked film, for example, and for this baked film, preferably a good conductor whose primary component is nickel, copper, palladium, platinum, silver, gold, or alloy thereof, etc., may be used. The intermediate films 122, 132 are constituted by a plating film, for example, and for this plating film, preferably a good conductor whose primary component is platinum, palladium, gold, copper, nickel, or alloy thereof, etc., may be used. The surface films 123, 133 are constituted by a plating film, for example, and for this plating film, preferably a good conductor whose primary component is copper, tin, palladium, gold, zinc, or alloy thereof, etc., may be used.

Figure 6A:
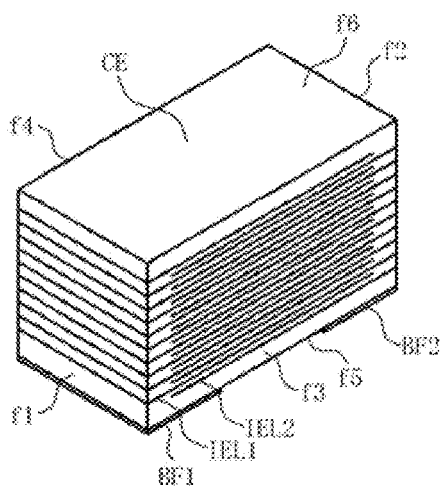
FIGS. 6A to 6C are drawings provided to explain an example of a manufacturing method of the multilayer ceramic capacitor shown in FIG. 1.
Figure 6B:
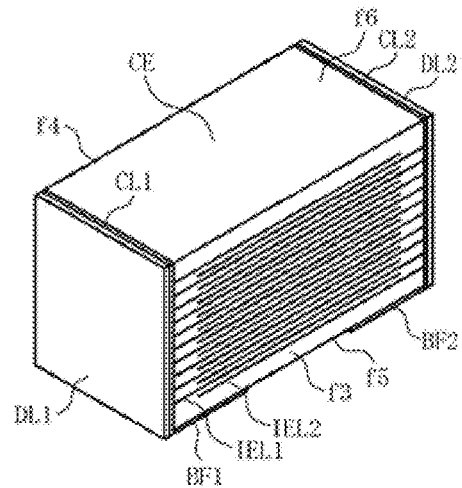
Figure 6C:
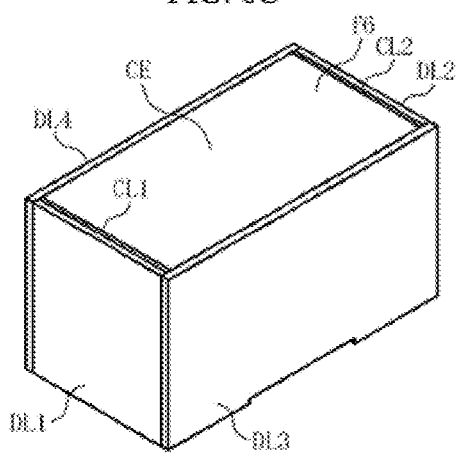

Next, an example of manufacturing method appropriate for the aforementioned multilayer ceramic capacitor is explained by using FIGS. 6A to 6C, and also using the symbols, etc., shown in FIGS. 1 to 5B as deemed appropriate.

For the manufacture, a ceramic slurry containing dielectric ceramic powder, organic binder, organic solvent and various additives, an electrode paste containing good conductor powder, organic binder, organic solvent and various additives, and a conductor paste only containing good conductor powder, organic binder, and organic solvent, are prepared.

Next, the ceramic slurry is coated on the surface of a carrier film and then dried to produce a first sheet. Also, the electrode paste is printed on the surface of such first sheet and then dried to produce a second sheet on which internal electrode layer patterns are formed. Additionally, the electrode paste is printed on the surface of such first sheet and then dried to produce a third sheet on which base film patterns are formed. Furthermore, the conductor paste is printed on the surface of such first sheet and then dried to produce a fourth sheet on which conductor layer patterns are formed.

Next, a specified number of unit sheets taken from the first sheet are stacked and thermally compressed one by one, to form an area corresponding to one height-direction margin of the capacitive element 111. Next, a specified number of unit sheets (including internal electrode layer patterns) taken from the second sheet are stacked and thermally compressed one by one, to form an area corresponding to the part of the capacitive element 111 where the first internal electrode layers 111a and second internal electrode layers 111b are present. Next, a specified number of unit sheets taken from the first sheet are stacked and thermally compressed one by one, to form an area corresponding to the other height-direction margin of the capacitive element 111. Next, a specified number of unit sheets (including base film patterns) taken from the third sheet are stacked with the base film patterns facing outward and then thermally compressed one by one, and lastly the entire laminate is thermally compressed for one last time, to produce an unsintered sheet.

Next, the unsintered sheet is cut into a grid to produce unsintered elements CE, each corresponding to the capacitive element 111 (refer to FIG. 6A). These unsintered elements CE each have multiple unsintered internal electrode layers IEL1, IEL2 that will become the first internal electrode layers 111a and second internal electrode layers 111b, and also have, on one height-direction face (fifth face f5), unsintered base films BF1, BF2 that will become the base film 121 of first external electrode 120 and the base film 131 of second external electrode 130.

Next, the many unsintered elements CE are aligned in orientation and the conductor layer pattern side of the fourth sheet is pressed and thermally compressed onto one length-direction face and the other length-direction face of each element, and after the thermal compression, the fourth sheet is cut to produce unsintered elements CE, each having an unsintered conductor layer CL1 and an unsintered cover layer DL1 formed on one length-direction face, which will become the first conductor layer 112 and first cover layer 114, respectively, as well as an unsintered conductor layer CL2 and an unsintered cover layer DL2 formed on the other length-direction face, which will become the second conductor layer 113 and second cover layer 115, respectively (refer to FIG. 6B).

Next, unsintered elements that each look like what is shown in FIG. 6B are aligned in orientation and the first sheet is pressed and thermally compressed onto one width-direction face and the other width-direction face of each element, respectively, and after the thermal compression, the first sheet is cut to produce unsintered elements, each having an unsintered cover layer DL3 formed on one width-direction face, which will become the third cover layer 116, as well as an unsintered cover layer DL4 formed on the other width-direction face, which will become the fourth cover layer 117 (refer to FIG. 6C).

Next, many unsintered elements that each look like what is shown in FIG. 6C are sintered (including binder removal and sintering) all at once in an ambience and at a temperature profile appropriate for the dielectric ceramic powder and good conductor powder contained therein, after which the many sintered elements are barreled, as necessary. This way, capacitor bodies 110, each having the base film 121 of first external electrode 120 and the base film 131 of second external electrode 130, are produced.

Next, intermediate films 122, 132 to cover the base film 121 of first external electrode 120 and the base film 131 of second external electrode 130 are formed by means of plating, while surface films 123, 133 to cover the intermediate films 122, 132 are formed by means of plating, to produce a first external electrode 120 and a second external electrode 130.

It should be noted that, while the aforementioned manufacturing example explained a method whereby a base film 121 of first external electrode 120 and a base film 131 of second external electrode 130 are formed before a capacitor body 110, it is possible to form a capacitor body 110 without base films 121, 131 first, and print the electrode paste over the areas of the capacitor body 110 where external electrodes will be formed and then dry and bake the paste to form base films 121, 131, and thereafter form intermediate films 122, 132 and surface films 123, 133, in this order, to produce a first external electrode 120 and a second external electrode 130.

Next, the effects (effects e1 to e5) achieved by the aforementioned multilayer ceramic capacitor are explained.

(e1) The capacitor body 110 comprises: (1) a capacitive element 111 of roughly rectangular solid shape, which contains multiple first internal electrode layers 111a of roughly rectangular shape and multiple second internal electrode layers 111b of roughly rectangular shape that are arranged alternately with dielectric layers in between; (2) a first conductor layer 112 covering one length-direction face of the capacitive element 111; (3) a second conductor layer 113 covering the other length-direction face of the capacitive element 111; (4) a first cover layer 114 covering the exterior face of the first conductor layer 112; (5) a second cover layer 115 covering the exterior face of the second conductor layer 113; (6) a third cover layer 116 covering one width-direction face of the capacitive element 111, one width-direction end of the first conductor layer 112, and one width-direction end of the second conductor layer 113, while also in contact with one width-direction end of the first cover layer 114 and one width-direction end of the second cover layer 115; and (7) a fourth cover layer 117 covering the other width-direction face of the capacitive element 111, the other width-direction end of the first conductor layer 112, and the other width-direction end of the second conductor layer 113, while also in contact with the other width-direction end of the first cover layer 114 and the other width-direction end of the second cover layer 115. Also, one length-direction ends of the multiple first internal electrode layers 111a are connected to the first conductor layer 112 over connection widths that are equivalent to the respective widths of the multiple first internal electrode layers 111a, while the other length-direction ends of the multiple second internal electrode layers 111b are connected to the second conductor layer 113 over connection widths that are equivalent to the respective widths of the multiple second internal electrode layers 111b, and also, one height-direction end of the first conductor layer 112 is connected to the first external electrode 120 over a connection width equivalent to the width of the first conductor layer 112, while one height-direction end of the second conductor layer 113 is connected to the second external electrode 130 over a connection width equivalent to the width of the second conductor layer 113.

In other words, the capacitor body 110 has the first conductor layer 112 whose function is to utilize the width of each first internal electrode layer 111a to connect it to the first external electrode 120, as well as the second conductor layer 113 whose function is to utilize the width of each second internal electrode layer 111b to connect it to the second external electrode 130, and therefore it is possible to maximally prevent the connection of each first internal electrode layer 111a to the first external electrode 120, and the connection of each second internal electrode layer 111b to the second external electrode 130, from becoming unstable even when the width and length of each first internal electrode layer 111a, and the width and length of each second internal electrode layer 111b, are reduced. This means that the multilayer ceramic capacitor comprising the capacitor body 110 of roughly rectangular solid shape, as well as the first external electrode 120 and second external electrode 130 provided on one height-direction face thereof, can achieve reliable connection with respect to the connection of each first internal electrode layer 111a to the first external electrode 120, and also with respect to the connection of each second internal electrode layer 111b to the second external electrode 130, even when meeting the demand for size reduction and capacitance increase.

Also, the capacitor body 110 has: the first cover layer 114 covering the exterior face of the first conductor layer 112; the second cover layer 115 covering the exterior face of the second conductor layer 113; the third cover layer 116 covering one width-direction face of the capacitive element 111, one width-direction end of the first conductor layer 112, and one width-direction end of the second conductor layer 113, while also in contact with one width-direction end of the first cover layer 114 and one width-direction end of the second cover layer 115; and the fourth cover layer 117 covering the other width-direction face of the capacitive element 111, the other width-direction end of the first conductor layer 112, and the other width-direction end of the second conductor layer 113, while also in contact with the other width-direction end of the first cover layer 114 and the other width-direction end of the second cover layer 115. This means that, even when the multilayer ceramic capacitor falls over the circuit board during mounting, the problem of the first conductor layer 112 and second conductor 113 contacting and therefore shorting with any conductor line on the circuit board or any adjacent electronic component, etc., is prevented.

(e2) Of the third cover layer 116 and fourth cover layer 117 positioned on the two width-direction faces of the capacitor body 110, the third cover layer 116 has the first supporting part 116a and second supporting part 116b that extend to one width-direction ends of the first external electrode 120 and second external electrode 130, respectively, while the fourth cover layer 117 has the first supporting part 117a and second supporting part 117b that extend to the other width-direction ends of the first external electrode 120 and second external electrode 130, respectively. In other words, the two width-direction ends of the first external electrode 120 are supported by the first supporting parts 116a, 117a, while the two width-direction ends of the second external electrode 130 are supported by the second supporting parts 116b, 117b, and therefore the stability of the first external electrode 120 and that of the second external electrode 130 can be improved.

(e3) Of the first cover layer 114 and second cover layer 115 positioned on the two length-direction faces of the capacitor body 110, the first cover layer 114 has the supporting part 114a that extends to one length-direction end of the first external electrode 120, while the second cover layer 115 has the supporting part 115a that extends to the other length-direction end of the second external electrode 130. In other words, one length-direction end of the first external electrode 120 is supported by the supporting part 114a, while the other length-direction end of the second external electrode 130 is supported by the supporting part 115a, and therefore the stability of the first external electrode 120 and that of the second external electrode 130 can be improved.

(e4) The thickness of the first conductor layer 112 and that of the second conductor layer 113, of the capacitor body 110, are set in a range of one to five times the thickness of each of the multiple first internal electrode layers 111a and each of the multiple second internal electrode layers 111b, respectively, and therefore it is possible to maximally prevent the length L of the multilayer ceramic capacitor from increasing due to the thickness of the first conductor layer 112 and that of the second conductor layer 113.

(e5) The thickness of the first cover layer 114 and that of the second cover layer 115, of the capacitor body 110, are set in a range of one to 10 times the thickness of the dielectric layer of the capacitive element 111, and therefore it is possible to maximally prevent the length L of the multilayer ceramic capacitor from increasing due to the thickness of the first cover layer 114 and that of the second cover layer 115. In addition, the thickness of the third cover layer 116 and that of the fourth cover layer 117, of the capacitor body 110, are set in a range of one to 20 times the thickness of the first cover layer 114 or that of the second cover layer 115, and therefore it is possible to maximally prevent the width W of the multilayer ceramic capacitor from increasing due to the thickness of the third cover layer 116 and that of the fourth cover layer 117.

Second Embodiment

Figure 7:
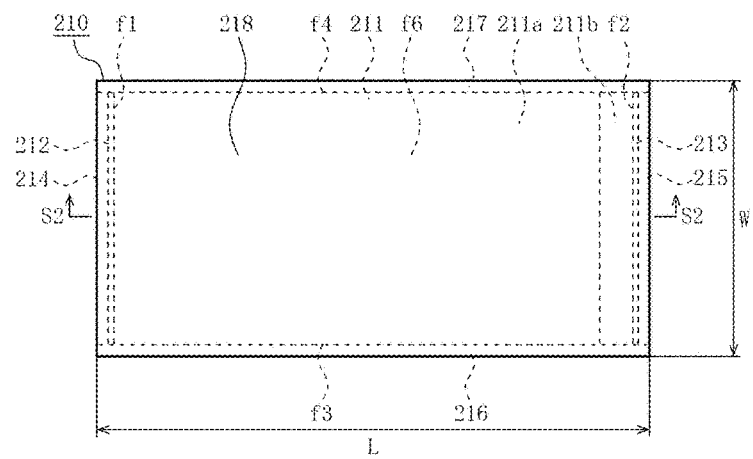
FIG. 7 is a view of the multilayer ceramic capacitor pertaining to the second embodiment of the present invention, from the sixth face f6 side of the capacitive element.
Figure 8:
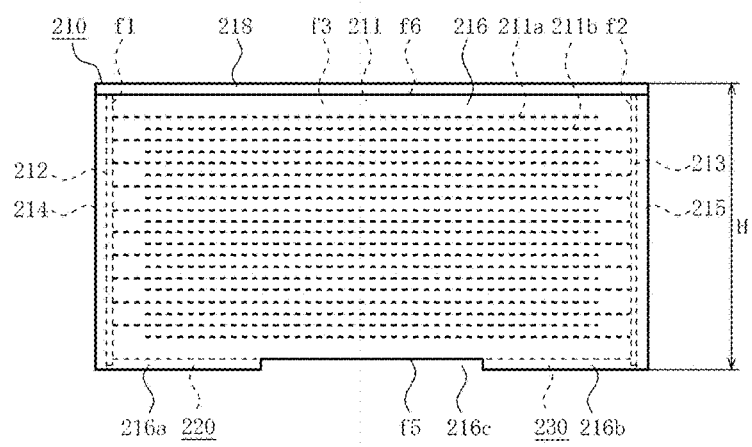
FIG. 8 is a view of the multilayer ceramic capacitor shown in FIG. 7, from the third face f3 side of the capacitive element.
Figure 9:
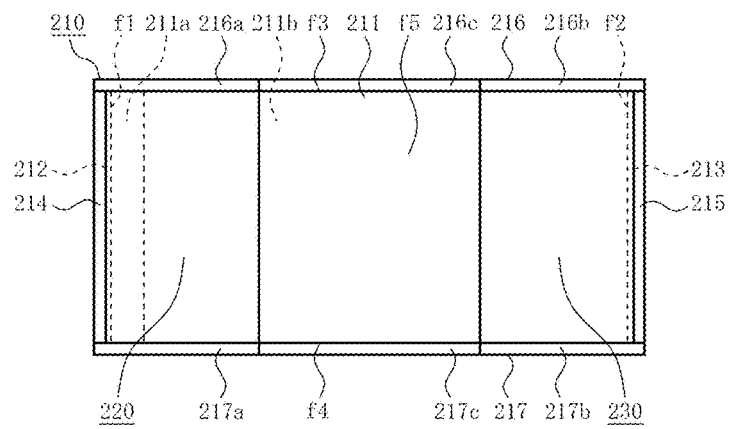
FIG. 9 is a view of the multilayer ceramic capacitor shown in FIG. 7, from the fifth face f5 side of the capacitive element.
Figure 10:
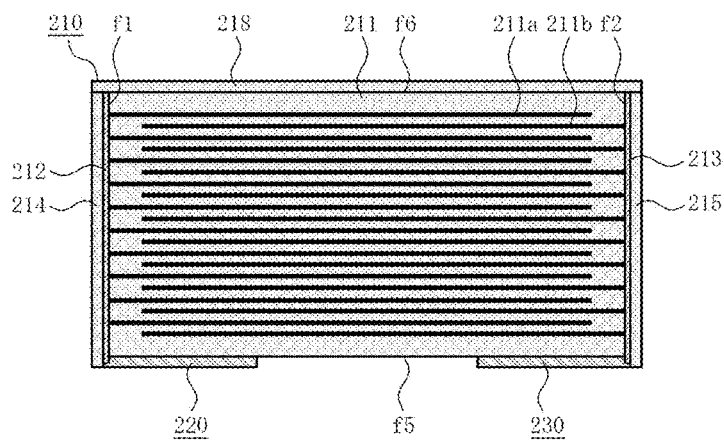
FIG. 10 is a section view of FIG. 7 along line S2-S2.

First, the construction of the multilayer ceramic capacitor pertaining to the second embodiment of the present invention is explained using FIGS. 7 to 11B. In this explanation, the left/right or horizontal direction in FIG. 7 represents the length direction, the up/down or vertical direction in FIG. 7 represents the width direction, and the up/down or vertical direction in FIG. 8 represents the height direction, while the dimensions of each component in the length direction, width direction, and height direction represent the length, width, and height of the component, respectively.

Among the symbols shown in FIGS. 7 to 11B, 210 denotes the capacitor body, 211 denotes the capacitive element, 211a denotes the first internal electrode layer, 211b denotes the second internal electrode layer, 212 denotes the first conductor layer, 213 denotes the second conductor layer, 214 denotes the first cover layer, 214a denotes the supporting part of the first cover layer, 215 denotes the second cover layer, 215a denotes the supporting part of the second cover layer, 216 denotes the third cover layer, 216a denotes the first supporting part of the third cover layer, 216b denotes the second supporting part of the third cover layer, 217 denotes the fourth cover layer, 217a denotes the first supporting part of the fourth cover layer, 217b denotes the second supporting part of the fourth cover layer, 218 denotes the fifth cover layer, 220 denotes the first external electrode, 221 denotes the base film of the first external electrode, 222 denotes the intermediate film of the first external electrode, 223 denotes the surface film of the first external electrode, 230 denotes the second external electrode, 231 denotes the base film of the second external electrode, 232 denotes the intermediate film of the second external electrode, and 233 denotes the surface film of the second external electrode. Since the constitutions of the parts of the multilayer ceramic capacitor shown in FIGS. 7 to 11B are the same as those of the parts of the same names as explained in <<First Embodiment>> above, except for the fifth cover layer 218, the following primarily explains this difference.

The fifth cover layer 218 is roughly rectangular in shape, and is in contact with and covers the sixth face f6 of the capacitive element 211, the other height-direction end of the first conductor layer 212, and the other height-direction end of the second conductor layer 213, while also in contact with the other height-direction end of the first cover layer 214, the other height-direction end of the second cover layer 215, the other height-direction end of the third cover layer 216, and the other height-direction end of the fourth cover layer 217. The length of the fifth cover layer 218 is roughly the same as the length of the third cover layer 216 and that of the fourth cover layer 217. The width of the fifth cover layer 218 is roughly the same as the sum of the width of the sixth face f6 of the capacitive element 211, thickness of the third cover layer 216, and thickness of the fourth cover layer 217. Because it relates to the height of the capacitor body 210, desirably the thickness of the fifth cover layer 218 is as thin as possible. Incidentally, the thickness of the fifth cover layer 218 is set in a range of one to 20 times the thickness of the first cover layer 214 or that of the second cover layer 215, or preferably in a range of 5 to 20 μm, for example. Also, for the fifth cover layer 218, a dielectric ceramic whose primary component is barium titanate, strontium titanate, calcium titanate, magnesium titanate, calcium zirconate, calcium zirconate titanate, barium zirconate, titanium oxide, etc., or preferably a high dielectric ceramic whose specific dielectric constant is 1000 or higher, or more preferably a dielectric ceramic whose primary component is the same as the primary component of the capacitive element 211 except for the first internal electrode layer 211a and second internal electrode layer 211b, may be used.

Next, an example of manufacturing method appropriate for the aforementioned multilayer ceramic capacitor is explained by using FIGS. 12A to 12D, and also using the symbols, etc., shown in FIGS. 7 to 11B as deemed appropriate.

For the manufacture, a ceramic slurry containing dielectric ceramic powder, organic binder, organic solvent and various additives, an electrode paste containing good conductor powder, organic binder, organic solvent and various additives, and a conductor paste only containing good conductor powder, organic binder, and organic solvent, are prepared.

Next, the ceramic slurry is coated on the surface of a carrier film and then dried to produce a first sheet. Also, the electrode paste is printed on the surface of such first sheet and then dried to produce a second sheet on which internal electrode layer patterns are formed. Additionally, the electrode paste is printed on the surface of such first sheet and then dried to produce a third sheet on which base film patterns are formed. Furthermore, the conductor paste is printed on the surface of such first sheet and then dried to produce a fourth sheet on which conductor layer patterns are formed.

Next, a specified number of unit sheets taken from the first sheet are stacked and thermally compressed one by one, to form an area corresponding to one height-direction margin of the capacitive element 211. Next, a specified number of unit sheets (including internal electrode layer patterns) taken from the second sheet are stacked and thermally compressed one by one, to form an area corresponding to the part of the capacitive element 211 where the first internal electrode layers 211a and second internal electrode layers 211b are present. Next, a specified number of unit sheets taken from the first sheet are stacked and thermally compressed one by one, to form an area corresponding to the other height-direction margin of the capacitive element 211. Next, a specified number of unit sheets (including base film patterns) taken from the third sheet are stacked with the base film patterns facing outward and then thermally compressed one by one, and lastly the entire laminate is thermally compressed for one last time, to produce an unsintered sheet.

Figure 12A:
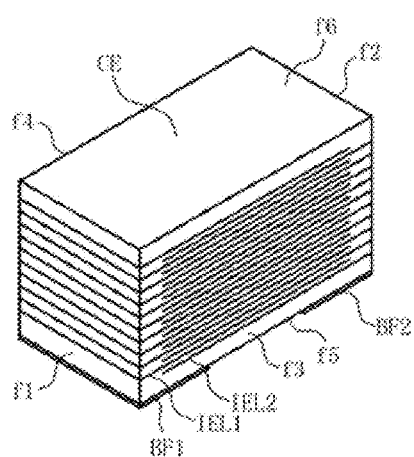
FIGS. 12A to 12D are drawings provided to explain an example of a manufacturing method of the multilayer ceramic capacitor shown in FIG. 7.

Next, the unsintered sheet is cut into a grid to produce unsintered elements CE, each corresponding to the capacitive element 211 (refer to FIG. 12A). These unsintered elements CE each have multiple unsintered internal electrode layers IEL1, IEL2 that will become the first internal electrode layers 211a and second internal electrode layers 211b, and also have, on one height-direction face (fifth face f5), unsintered base films BF1, BF2 that will become the base film 221 of first external electrode 220 and the base film 231 of second external electrode 230.

Figure 12B:
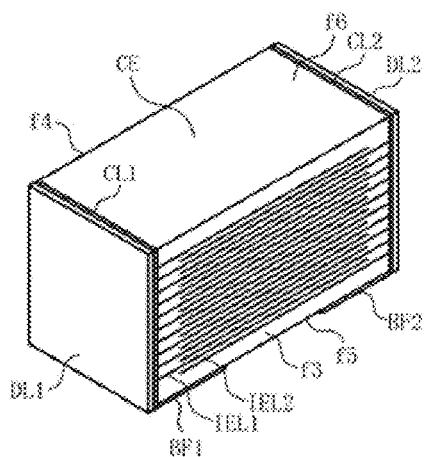

Next, the many unsintered elements CE are aligned in orientation and the conductor layer pattern side of the fourth sheet is pressed and thermally compressed onto one length-direction face and the other length-direction face of each element, and after the thermal compression, the fourth sheet is cut to produce unsintered elements CE, each having an unsintered conductor layer CL1 and an unsintered cover layer DL1 formed on one length-direction face, which will become the first conductor layer 212 and first cover layer 214, respectively, as well as an unsintered conductor layer CL2 and an unsintered cover layer DL2 formed on the other length-direction face, which will become the second conductor layer 213 and second cover layer 215, respectively (refer to FIG. 12B).

Figure 12C:
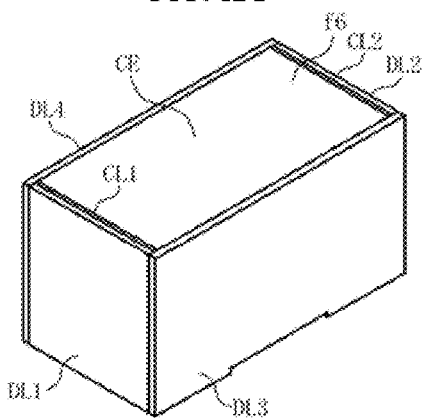

Next, unsintered elements that each look like what is shown in FIG. 12B are aligned in orientation and the first sheet is pressed and thermally compressed onto one width-direction face and the other width-direction face of each element, respectively, and after the thermal compression, the first sheet is cut to produce unsintered elements, each having an unsintered cover layer DL3 formed on one width-direction face of what is shown in FIG. 12B, which will become the third cover layer 216, as well as an unsintered cover layer DL4 formed on the other width-direction face, which will become the fourth cover layer 217 (refer to FIG. 12C).

Figure 12D:
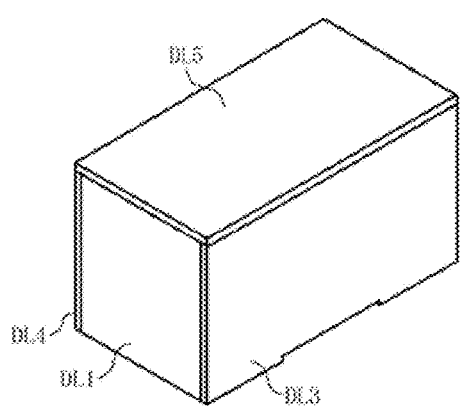

Next, unsintered elements that each look like what is shown in FIG. 12C are aligned in orientation and the first sheet is pressed and thermally compressed onto the other height-direction face of each element, and after the thermal compression, the first sheet is cut to produce unsintered elements, each having an unsintered cover layer DL5 formed on the other height-direction face of what is shown in FIG. 12C, which will become the fifth cover layer 218 (refer to FIG. 12D).

Next, many unsintered elements that each look like what is shown in FIG. 12D are sintered (including binder removal and sintering) all at once in an ambience and at a temperature profile appropriate for the dielectric ceramic powder and good conductor powder contained therein, after which the many sintered elements are barreled, as necessary. This way, capacitor bodies 210, each having the base film 221 of first external electrode 220 and the base film 231 of second external electrode 230, are produced.

Next, intermediate films 222, 232 to cover the base film 221 of first external electrode 220 and the base film 231 of second external electrode 230 are formed by means of plating, while surface films 223, 233 to cover the intermediate films 222, 232 are formed by means of plating, to produce a first external electrode 220 and a second external electrode 230.

It should be noted that, while the aforementioned manufacturing example explained a method whereby a base film 221 of first external electrode 220 and a base film 231 of second external electrode 230 are formed before a capacitor body 210, it is possible to form a capacitor body 210 without base films 221, 231 first, and print the electrode paste over the areas of the capacitor body 210 where external electrodes will be formed and then dry and bake the paste to form base films 221, 231, and thereafter form intermediate films 222, 232 and surface films 223, 233, in this order, to produce a first external electrode 220 and a second external electrode 230.

Figure 11A:
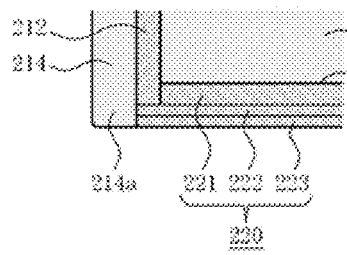
FIGS. 11A and 11B are each a partially enlarged view of FIG. 10.
Figure 11B:
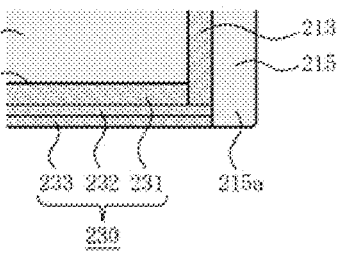

While FIGS. 11A and 11B show the first external electrode 220 and second external electrode 230 of a three-layer structure, the first external electrode 220 and second external electrode 230 need not have a three-layer structure, as in the first embodiment; instead, they can have a two-layer structure having no intermediate film 222 or 232, a multi-layer structure having two or more intermediate films 222 or 232, or a single-layer structure having only a surface film 223 or 233. Additionally, while FIGS. 8, 11A, and 11B show that one length-direction end, one width-direction end, and the other width-direction end of the first external electrode 220 are covered and hidden by the supporting part 214a of the first cover layer 214, first supporting part 216a of the third cover layer 216, and first supporting part 217a of the fourth cover layer 217, while the other length-direction end, one width-direction end, and the other width-direction end of the second external electrode 230 are covered and hidden by the supporting part 215a of the second cover layer 215, second supporting part 216b of the third cover layer 216, and second supporting part 217b of the fourth cover layer 217, one length-direction end, one width-direction end, and the other width-direction end of the first external electrode 220 need not be covered and hidden by the respective supporting parts 214a, 216a, 217a, while the other length-direction end, one width-direction end, and the other width-direction end of the second external electrode 230 need not be covered and hidden by the respective supporting parts 215a, 216b, 217b, so long as the respective supporting parts 214a, 216a, 217a extend to one length-direction end, one width-direction end, and the other width-direction end of the first external electrode 220, while the respective supporting parts 215a, 216b, 217b extend to the other length-direction end, one width-direction end, and the other width-direction end of the second external electrode 230, as in the first embodiment. In other words, one length-direction end, one width-direction end, and the other width-direction end of the first external electrode 220 may be covered by the respective supporting parts 214a, 216a, 217a in such a way that the exterior side of the first external electrode 220 in the thickness direction, such as the intermediate film 222 and surface film 223 shown in FIG. 11A, is exposed, while the other length-direction end, one width-direction end, and the other width-direction end of the second external electrode 230 may be covered by the respective supporting parts 215a, 216b, 217b in such a way that the exterior side of the second external electrode 230 in the thickness direction, such as the intermediate film 232 and surface film 233 shown in FIG. 11B, is exposed.

Next, the effects achieved by the aforementioned multilayer ceramic capacitor are explained. According to the aforementioned multilayer ceramic capacitor, effects that are similar to the aforementioned effects e1 to e5 explained in <<First Embodiment>> above can be achieved, along with the effect e6 explained below.

(e6) The capacitor body 210 has the fifth cover layer 218 covering the other height-direction face of the capacitive element 211, the other height-direction end of the first conductor layer 212, and the other height-direction end of the second conductor layer 213, while also in contact with the other height-direction end of the first cover layer 214, the other height-direction end of the second cover layer 215, the third cover layer 216, and the fourth cover layer 217. This means that, even when the multilayer ceramic capacitor falls over on the circuit board during mounting, the problem of the first conductor layer 212 and second conductor 213 contacting and therefore shorting with any conductor line on the circuit board or any adjacent electronic component, etc., is prevented in a more reliable manner.

Third Embodiment

Figure 13:
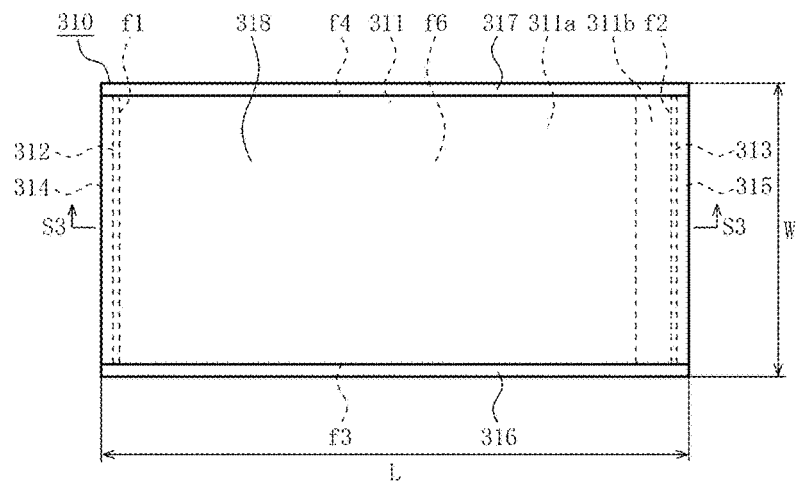
FIG. 13 is a view of the multilayer ceramic capacitor pertaining to the third embodiment of the present invention, from the sixth face f6 side of the capacitive element.
Figure 14:
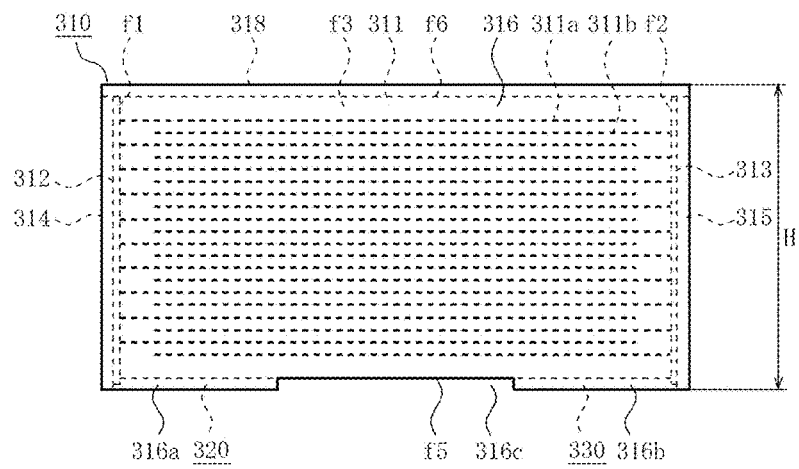
FIG. 14 is a view of the multilayer ceramic capacitor shown in FIG. 13, from the third face f3 side of the capacitive element.
Figure 15:
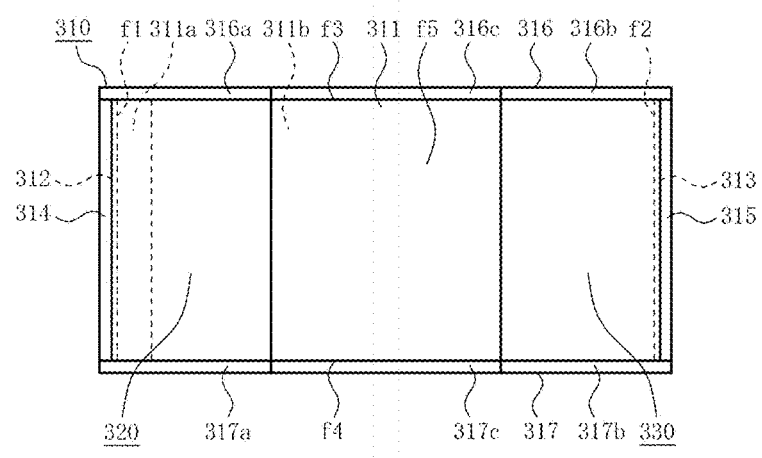
FIG. 15 is a view of the multilayer ceramic capacitor shown in FIG. 13, from the fifth face f5 side of the capacitive element.
Figure 16:
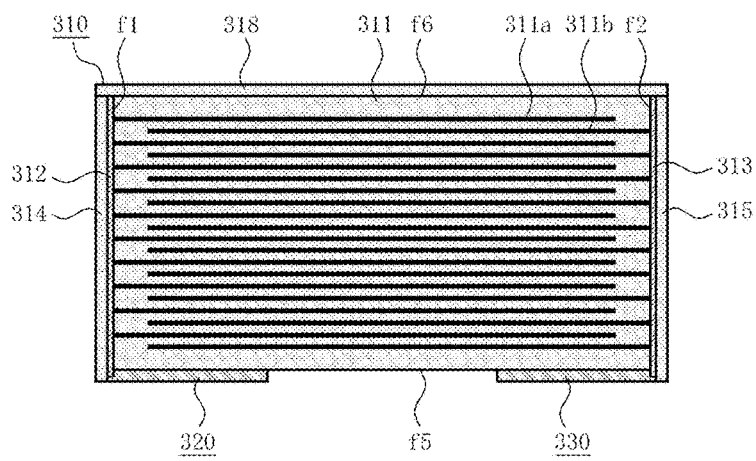
FIG. 16 is a section view of FIG. 13 along line S3-S3.

First, the construction of the multilayer ceramic capacitor pertaining to the third embodiment of the present invention is explained using FIGS. 13 to 17B. In this explanation, the left/right or horizontal direction in FIG. 13 represents the length direction, the up/down or vertical direction in FIG. 13 represents the width direction, and the up/down or vertical direction in FIG. 14 represents the height direction, while the dimensions of each component in the length direction, width direction, and height direction represent the length, width, and height of the component, respectively.

Among the symbols shown in FIGS. 13 to 17B, 310 denotes the capacitor body, 311 denotes the capacitive element, 311a denotes the first internal electrode layer, 311b denotes the second internal electrode layer, 312 denotes the first conductor layer, 313 denotes the second conductor layer, 314 denotes the first cover layer, 314a denotes the supporting part of the first cover layer, 315 denotes the second cover layer, 315*a* denotes the supporting part of the second cover layer, 316 denotes the third cover layer, 316*a* denotes the first supporting part of the third cover layer, 316*b* denotes the second supporting part of the third cover layer, 317 denotes the fourth cover layer, 317*a* denotes the first supporting part of the fourth cover layer, 317*b* denotes the second supporting part of the fourth cover layer, 318 denotes the fifth cover layer, 320 denotes the first external electrode, 321 denotes the base film of the first external electrode, 322 denotes the intermediate film of the first external electrode, 323 denotes the surface film of the first external electrode, 330 denotes the second external electrode, 331 denotes the base film of the second external electrode, 332 denotes the intermediate film of the second external electrode, and 333 denotes the surface film of the second external electrode. Since the constitutions of the parts of the multilayer ceramic capacitor shown in FIGS. 13 to 17B are the same as those of the parts of the same names as explained in <<First Embodiment>> above, except for the fifth cover layer 318, the following primarily explains this difference.

The fifth cover layer 318 is roughly rectangular in shape, and is in contact with and covers the sixth face f6 of the capacitive element 311, the other height-direction end of the first conductor layer 312, and the other height-direction end of the second conductor layer 313, while also in contact with the other height-direction end of the first cover layer 314, the other height-direction end of the second cover layer 315, the interior side of the other height-direction end of the third cover layer 316, and the interior side of the other height-direction end of the fourth cover layer 317. The length of the fifth cover layer 318 is roughly the same as the length of the third cover layer 316 and that of the fourth cover layer 317. The width of the fifth cover layer 318 is roughly the same as the width of the sixth face f6 of the capacitive element 311. The height of the third cover layer 316 and that of the fourth cover layer 317 are higher by the thickness of the fifth cover layer 318. Because it relates to the height of the capacitor body 310, desirably the thickness of the fifth conductor layer 318 is as thin as possible. Incidentally, the thickness of the fifth cover layer 318 is set in a range of one to 20 times the thickness of the first cover layer 314 or that of the second cover layer 315, or preferably in a range of 5 to 20 µm, for example. Also, for the fifth cover layer 318, a dielectric ceramic whose primary component is barium titanate, strontium titanate, calcium titanate, magnesium titanate, calcium zirconate, calcium zirconate titanate, barium zirconate, titanium oxide, etc., or preferably a high dielectric ceramic whose specific dielectric constant is 1000 or higher, or more preferably a dielectric ceramic whose primary component is the same as the primary component of the capacitive element 311 except for the first internal electrode layer 311*a* and second internal electrode layer 311*b*, may be used.

Next, an example of manufacturing method appropriate for the aforementioned multilayer ceramic capacitor is explained by using FIGS. 18A to 18D, and also using the symbols, etc., shown in FIGS. 13 to 17B as deemed appropriate.

For the manufacture, a ceramic slurry containing dielectric ceramic powder, organic binder, organic solvent and various additives, an electrode paste containing good conductor powder, organic binder, organic solvent and various additives, and a conductor paste only containing good conductor powder, organic binder, and organic solvent, are prepared.

Next, the ceramic slurry is coated on the surface of a carrier film and then dried to produce a first sheet. Also, the electrode paste is printed on the surface of such first sheet and then dried to produce a second sheet on which internal electrode layer patterns are formed. Additionally, the electrode paste is printed on the surface of such first sheet and then dried to produce a third sheet on which base film patterns are formed. Furthermore, the conductor paste is printed on the surface of such first sheet and then dried to produce a fourth sheet on which conductor layer patterns are formed.

Next, a specified number of unit sheets taken from the first sheet are stacked and thermally compressed one by one, to form an area corresponding to one height-direction margin of the capacitive element 311. Next, a specified number of unit sheets (including internal electrode layer patterns) taken from the second sheet are stacked and thermally compressed one by one, to form an area corresponding to the part of the capacitive element 311 where the first internal electrode layers 311*a* and second internal electrode layers 311*b* are present. Next, a specified number of unit sheets taken from the first sheet are stacked and thermally compressed one by one, to form an area corresponding to the other height-direction margin of the capacitive element 311. Next, a specified number of unit sheets (including base film patterns) taken from the third sheet are stacked with the base film patterns facing outward and then thermally compressed one by one, and lastly the entire laminate is thermally compressed for one last time, to produce an unsintered sheet.

Next, the unsintered sheet is cut into a grid to produce unsintered elements CE, each corresponding to the capacitive element 311 (refer to FIG. 18A). These unsintered elements CE each have multiple unsintered internal electrode layers IEL1, IEL2 that will become the first internal electrode layers 311*a* and second internal electrode layers 311*b*, and also have, on one height-direction face (fifth face f5), unsintered base films BF1, BF2 that will become the base film 321 of first external electrode 320 and the base film 331 of second external electrode 330.

Next, the many unsintered elements CE are aligned in orientation and the conductor layer pattern side of the fourth sheet is pressed and thermally compressed onto one length-direction face and the other length-direction face of each element, and after the thermal compression, the fourth sheet is cut to produce unsintered elements CE, each having an unsintered conductor layer CL1 and an unsintered cover layer DL1 formed on one length-direction face, which will become the first conductor layer 312 and first cover layer 314, respectively, as well as an unsintered conductor layer CL2 and an unsintered cover layer DL2 formed on the other length-direction face, which will become the second conductor layer 313 and second cover layer 315, respectively (refer to FIG. 18B).

Next, unsintered elements that each look like what is shown in FIG. 18B are aligned in orientation and the first sheet is pressed and thermally compressed onto the other height-direction face of each element, and after the thermal compression, the first sheet is cut to produce unsintered elements, each having an unsintered cover layer DL5 formed on the other height-direction face of what is shown in FIG. 18C, which will become the fifth cover layer 318 (refer to FIG. 18C).

Next, unsintered elements that each look like what is shown in FIG. 18C are aligned in orientation and the first sheet is pressed and thermally compressed onto one width-direction face and the other width-direction face of each element, respectively, and after the thermal compression, the first sheet is cut to produce unsintered elements, each having an unsintered cover layer DL3 formed on one width-direction face of what is shown in FIG. 18C, which will become the third cover layer 316, as well as an unsintered cover layer DL4 formed on the other width-direction face, which will become the fourth cover layer 317 (refer to FIG. 18D).

Next, many unsintered elements that each look like what is shown in FIG. 18D are sintered (including binder removal and sintering) all at once in an ambience and at a temperature profile appropriate for the dielectric ceramic powder and good conductor powder contained therein, after which the many sintered elements are barreled, as necessary. This way, capacitor bodies 310, each having the base film 321 of first external electrode 320 and the base film 331 of second external electrode 330, are produced.

Next, intermediate films 322, 332 to cover the base film 321 of first external electrode 320 and the base film 331 of second external electrode 330 are formed by means of plating, while surface films 323, 333 to cover the intermediate films 322, 332 are formed by means of plating, to produce a first external electrode 320 and a second external electrode 330.

It should be noted that, while the aforementioned manufacturing example explained a method whereby a base film 321 of first external electrode 320 and a base film 331 of second external electrode 330 are formed before a capacitor body 310, it is possible to form a capacitor body 310 without base films 321, 331 first, and print the electrode paste over the areas of the capacitor body 310 where external electrodes will be formed and then dry and bake the paste to form base films 321, 331, and thereafter form intermediate films 322, 332 and surface films 323, 333, in this order, to produce a first external electrode 320 and a second external electrode 330.

Figure 17A:
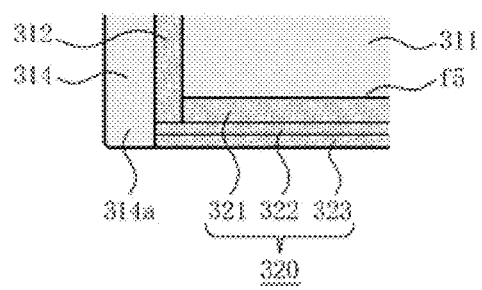
FIGS. 17A and 17B are each a partially enlarged view of FIG. 16.
Figure 17B:
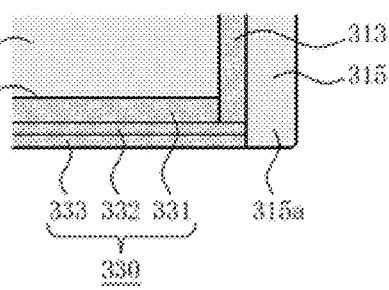

While FIGS. 17A and 17B show the first external electrode 320 and second external electrode 330 of a three-layer structure, the first external electrode 320 and second external electrode 330 need not have a three-layer structure, as in the first embodiment; instead, they can have a two-layer structure having no intermediate film 322 or 332, a multi-layer structure having two or more intermediate films 322 or 332, or a single-layer structure having only a surface film 323 or 333. Additionally, while FIGS. 14, 17A, and 17B show that one length-direction end, one width-direction end, and the other width-direction end of the first external electrode 320 are covered and hidden by the supporting part 314a of the first cover layer 314, first supporting part 316a of the third cover layer 316, and first supporting part 317a of the fourth cover layer 317, while the other length-direction end, one width-direction end, and the other width-direction end of the second external electrode 330 are covered and hidden by the supporting part 315a of the second cover layer 315, second supporting part 316b of the third cover layer 316, and second supporting part 317b of the fourth cover layer 317, one length-direction end, one width-direction end, and the other width-direction end of the first external electrode 320 need not be covered and hidden by the respective supporting parts 314a, 316a, 317a, while the other length-direction end, one width-direction end, and the other width-direction end of the second external electrode 330 need not be covered and hidden by the respective supporting parts 315a, 316b, 317b, so long as the respective supporting parts 314a, 316a, 317a extend to one length-direction end, one width-direction end, and the other width-direction end of the first external electrode 320, while the respective supporting parts 315a, 316b, 317b extend to the other length-direction end, one width-direction end, and the other width-direction end of the second external electrode 330, as in the first embodiment. In other words, one length-direction end, one width-direction end, and the other width-direction end of the first external electrode 320 may be covered by the respective supporting parts 314a, 316a, 317a in such a way that the exterior side of the first external electrode 320 in the thickness direction, such as the intermediate film 322 and surface film 323 shown in FIG. 17A, is exposed, while the other length-direction end, one width-direction end, and the other width-direction end of the second external electrode 330 may be covered by the respective supporting parts 315a, 316b, 317b in such a way that the exterior side of the second external electrode 330 in the thickness direction, such as the intermediate film 332 and surface film 333 shown in FIG. 17B, is exposed.

Next, the effects achieved by the aforementioned multilayer ceramic capacitor are explained. According to the aforementioned multilayer ceramic capacitor, effects that are similar to the aforementioned effects e1 to e5 explained in <<First Embodiment>> above can be achieved, along with the effect e7 explained below.

(e7) The capacitor body 310 has the fifth cover layer 318 covering the other height-direction face of the capacitive element 311, the other height-direction end of the first conductor layer 312, and the other height-direction end of the second conductor layer 313, while also in contact with the other height-direction end of the first cover layer 314, the other height-direction end of the second cover layer 315, the third cover layer 316, and the fourth cover layer 317. This means that, even when the multilayer ceramic capacitor falls over on the circuit board during mounting, the problem of the first conductor layer 312 and second conductor 313 contacting and therefore shorting with any conductor line on the circuit board or any adjacent electronic component, etc., is prevented in a more reliable manner.

VARIATION EXAMPLES

Next, variation examples (variation example m1 and variation example m2) that are common to the multilayer ceramic capacitor pertaining to the first embodiment, the multilayer ceramic capacitor pertaining to the second embodiment, and the multilayer ceramic capacitor pertaining to the third embodiment, as explained above, are explained.

(m1) By preparing the unsintered cover layers DL1, DL2 shown in FIGS. 6A to 6C, 12A to 12D, and 18A to 18D in such a way that they contain approx. 0.1 to 10 atomic percent of MgO or other oxidization accelerator, metal oxides can be interspersed in the first conductor layer 112, 212, or 312 and second conductor layer 113, 213, or 313 to be produced in the subsequent sintering process, primarily in the areas bordering the first cover layer 114, 214, or 314 and second cover layer 115, 215, or 315, respectively, so that consequently the adhesion of the first cover layer 114, 214, or 314 to the first conductor layer 112, 212, or 312 as well as the adhesion of the second cover layer 115, 215, or 315 to the second conductor layer 113, 213, or 313 can be increased because of these metal oxides.

(m2) By preparing the unsintered conductor layers CL1, CL2 shown in FIGS. 6 A to 6C, 12 A to 12D, and 18 A to 18D in such a way that they contain approx. 5 to 50 percent by weight of a dielectric ceramic powder whose primary component is the same as that of the capacitive element 111, 211, or 311 except for the first internal electrode layer 111a, 211a, or 311a and second internal electrode layer 111b, 211b, or 311b, the adhesion of the first conductor layer 112, 212, or 312 to the capacitive element 111, 211, or 311, as well as the adhesion of the second conductor layer 113, 213, or 313 to the capacitive element 111, 211, or 311 can be increased.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2016-061494, filed Mar. 25, 2016, the disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

I claim:

1. A multilayer ceramic capacitor, comprising:
a capacitor body of roughly rectangular solid shape, as well as a first external electrode of roughly rectangular shape and a second external electrode of roughly rectangular shape that are provided on one height-direction face thereof;
wherein the capacitor body comprises:
(1) a capacitive element of roughly rectangular solid shape, which contains multiple first internal electrode layers of roughly rectangular shape and multiple second internal electrode layers of roughly rectangular shape that are arranged alternately with dielectric layers in between; (2) a first conductor layer covering one length-direction face of the capacitive element without extending to the one height-direction face; (3) a second conductor layer covering another length-direction face of the capacitive element without extending to the one height-direction face; (4) a first dielectric ceramic cover layer having a thickness of 1-10 µm and covering an exterior face of the first conductor layer; (5) a second dielectric ceramic cover layer having a thickness of 1-10 µm and covering an exterior face of the second conductor layer; (6) a third cover layer covering one width-direction face of the capacitive element, one width-direction end face of the first conductor layer, and one width-direction end face of the second conductor layer, while also in contact with one width-direction end of the first cover layer and one width-direction end of the second cover layer; and (7) a fourth cover layer covering another width-direction face of the capacitive element, another width-direction end face of the first conductor layer, and another width-direction end face of the second conductor layer, while also in contact with another width-direction end of the first cover layer and another width-direction end of the second cover layer;
wherein one length-direction ends of the multiple first internal electrode layers are exposed on the one length-direction face and in contact with and electrically connected to the first conductor layer over connection widths that are equivalent to respective widths of the multiple first internal electrode layers;
wherein other length-direction ends of the multiple second internal electrode layers are exposed on the other length-direction face and in contact with and electrically connected to the second conductor layer over connection widths that are equivalent to respective widths of the multiple second internal electrode layers;
wherein one height-direction end of the first conductor layer is in contact with and electrically connected to the first external electrode over a connection width equivalent to a width of the first conductor layer; and
wherein one height-direction end of the second conductor layer is in contact with and electrically connected to the second external electrode over a connection width equivalent to the width of the second conductor layer.

2. A multilayer ceramic capacitor according to claim 1, wherein the third cover layer has a first supporting part that extends to and supportively contacts one width-direction end face of the first external electrode and a second supporting part that extends to and supportively contacts one width-direction end face of the second external electrode; and the fourth cover layer has a first supporting part that extends to and supportively contacts another width-direction end face of the first external electrode and a second supporting part that extends to and supportively contacts another width-direction end face of the second external electrode.

3. A multilayer ceramic capacitor according to claim 1, wherein the first cover layer has a supporting part that extends to and supportively contacts one length-direction end face of the first external electrode; and
the second cover layer has a supporting part that extends to and supportively contacts another length-direction end of the second external electrode.

4. A multilayer ceramic capacitor according to claim 2, wherein the first cover layer has a supporting part that extends to and supportively contacts one length-direction end face of the first external electrode; and
the second cover layer has a supporting part that extends to and supportively contacts another length-direction end of the second external electrode.

5. A multilayer ceramic capacitor according to claim 1, wherein the capacitor body further has (8) a fifth cover layer covering another height-direction face of the capacitive element, another height-direction end face of the first conductor layer, and another height-direction end face of the second conductor layer, while also in contact with another height-direction end of the first cover layer, another height-direction end of the second cover layer, the third cover layer, and the fourth cover layer.

6. A multilayer ceramic capacitor according to claim 2, wherein the capacitor body further has (8) a fifth cover layer covering another height-direction face of the capacitive element, another height-direction end face of the first conductor layer, and another height-direction end face of the second conductor layer, while also in contact with another height-direction end of the first cover layer, another height-direction end of the second cover layer, the third cover layer, and the fourth cover layer.

7. A multilayer ceramic capacitor according to claim 3, wherein the capacitor body further has (8) a fifth cover layer covering another height-direction face of the capacitive element, another height-direction end face of the first conductor layer, and another height-direction end face of the second conductor layer, while also in contact with another height-direction end of the first cover layer, another height-direction end of the second cover layer, the third cover layer, and the fourth cover layer.

8. A multilayer ceramic capacitor according to claim 1, wherein a thickness of the first conductor layer and that of the second conductor layer are set in a range of one to five times a thickness of each of the multiple first internal electrode layers and that of each of the multiple second internal electrode layers, respectively.

9. A multilayer ceramic capacitor according to claim 2, wherein a thickness of the first conductor layer and that of the second conductor layer are set in a range of one to five times a thickness of each of the multiple first internal electrode layers and that of each of the multiple second internal electrode layers, respectively.

10. A multilayer ceramic capacitor according to claim 3, wherein a thickness of the first conductor layer and that of the second conductor layer are set in a range of one to five times a thickness of each of the multiple first internal electrode layers and that of each of the multiple second internal electrode layers, respectively.

11. A multilayer ceramic capacitor according to claim 1, wherein a thickness of the first cover layer and that of the second cover layer are set in a range of one to 10 times a thickness of the dielectric layer of the capacitive element.

12. A multilayer ceramic capacitor according to claim 2, wherein a thickness of the first cover layer and that of the second cover layer are set in a range of one to 10 times a thickness of the dielectric layer of the capacitive element.

13. A multilayer ceramic capacitor according to claim 3, wherein a thickness of the first cover layer and that of the second cover layer are set in a range of one to 10 times a thickness of the dielectric layer of the capacitive element.

14. A multilayer ceramic capacitor according to claim 1, wherein a thickness of the third cover layer and that of the fourth cover layer are set in a range of one to 20 times a thickness of the first cover layer and that of the second cover layer, respectively.

15. A multilayer ceramic capacitor according to claim 2, wherein a thickness of the third cover layer and that of the fourth cover layer are set in a range of one to 20 times a thickness of the first cover layer and that of the second cover layer, respectively.

16. A multilayer ceramic capacitor according to claim 3, wherein a thickness of the third cover layer and that of the fourth cover layer are set in a range of one to 20 times a thickness of the first cover layer and that of the second cover layer, respectively.

17. A multilayer ceramic capacitor according to claim 1, wherein the first conductor layer is a non-plated, sintered layer whereas the first external electrode includes a plated layer, and the second conductor layer is a non-plated, sintered layer whereas the second external electrode includes a plated layer.

18. A multilayer ceramic capacitor according to claim 1, wherein the first, second, third, and forth cover layers are constituted by high dielectric ceramics.

19. A multilayer ceramic capacitor according to claim 1, wherein the first and second conductor layers have a thickness of 0.5-5 μm.

* * * * *